(12) United States Patent
Hosein et al.

(10) Patent No.: US 9,733,271 B2
(45) Date of Patent: Aug. 15, 2017

(54) SYSTEMS AND METHODS FOR PROVIDING AN ENHANCED USER EXPERIENCE AT A VENUE OR EVENT

(71) Applicant: EBAY INC., San Jose, CA (US)

(72) Inventors: Marc Hosein, San Jose, CA (US);
Steve Yankovich, San Jose, CA (US);
Nate Lyman, San Jose, CA (US);
Selina Lam, San Jose, CA (US)

(73) Assignee: EBAY INC., San Jose, CA (US)

( * ) Notice: Subject to any disclaimer, the term of this patent is extended or adjusted under 35 U.S.C. 154(b) by 879 days.

(21) Appl. No.: 13/938,460

(22) Filed: Jul. 10, 2013

(65) Prior Publication Data

US 2014/0046802 A1  Feb. 13, 2014

Related U.S. Application Data

(60) Provisional application No. 61/681,556, filed on Aug. 9, 2012.

(51) Int. Cl.
*G06Q 30/00* (2012.01)
*G01R 1/067* (2006.01)
*G06Q 30/06* (2012.01)

(52) U.S. Cl.
CPC ......... *G01R 1/06711* (2013.01); *G06Q 30/06* (2013.01); *G06Q 30/0623* (2013.01)

(58) Field of Classification Search
CPC ............................ G06Q 30/00; G06Q 30/0623
USPC ...................................................... 705/26, 27
See application file for complete search history.

(56) References Cited

U.S. PATENT DOCUMENTS

| | | | | |
|---|---|---|---|---|
| 8,126,782 B1* | 2/2012 | Zhu | ................ | G06Q 10/063114 705/22 |
| 2005/0228583 A1* | 10/2005 | Capuano | ................ | G06Q 30/02 701/408 |
| 2006/0180647 A1* | 8/2006 | Hansen | ..................... | B60S 3/00 235/375 |
| 2009/0203367 A1* | 8/2009 | Pamminger | ............ | G06Q 30/00 455/414.3 |
| 2009/0319306 A1* | 12/2009 | Chanick | ............. | G01C 21/3679 705/5 |
| 2012/0059729 A1* | 3/2012 | Roa | .................... | G06Q 30/0601 705/26.1 |
| 2012/0215637 A1* | 8/2012 | Hermann | ........... | G06Q 30/0207 705/14.53 |

OTHER PUBLICATIONS

"Nothing But Air—A new Aruba wireless network is a slam dunk to help the American Airlines Center cut costs, increase revenue and improve customer service," Network Computing Mar. 3, 2005, ProQuest Dialog #129817332, 13pgs.*

(Continued)

*Primary Examiner* — Rob Pond
(74) *Attorney, Agent, or Firm* — Maschoff Brennan

(57) ABSTRACT

Systems and methods for providing an enhanced user experience at an event or venue are provided. The systems and methods provided herein provide venue-specific location-based services to the user through the user's mobile device. Such services include allowing a user to order merchandise and concessions from their seat using their mobile device and delivering the ordered items to their seat. Such services also include determining a user's seat location from a scanned code on the user's ticket and providing a map to and from their seat.

20 Claims, 14 Drawing Sheets

(56) References Cited

OTHER PUBLICATIONS

Hunt, John: "Ducks aren't through yet, play host to Weber State in CBI," The Oregonian Mar. 14, 2011; ProQuest Dialog #856918505 4pgs.*

* cited by examiner

SYSTEMS AND METHODS FOR PROVIDING AN ENHANCED USER EXPERIENCE AT A VENUE OR EVENT

CROSS REFERENCE TO RELATED APPLICATIONS

Pursuant to 35 U.S.C. §119(e), this application claims priority to U.S. Provisional Patent Application No. 61/681,556, filed on Aug. 9, 2012, the disclosure of which is hereby incorporated by reference herein in its entirety.

BACKGROUND

Technical Field

Embodiments disclosed herein are related to devices, systems, and methods for taking advantage of the wireless connectivity of modern stadiums to provide an enhanced user experience at a venue or event. In particular, systems and methods provided herein may allow a user to receive venue-specific location-based services using their mobile device.

Related Art

Computing devices have become routine appliances in the homes of most families. Mobile computing devices, such as mobile phones, smartphones, and tablet computers have become as much a part of a person's daily accessories as a wallet or purse. People bring their mobile computing devices to sporting events and concerts so that they can share information related to the event with their friends and family. Event providers such as stadiums and arenas understand the increased use of mobile computing devices by the people attending their events and are starting to provide increased support for these devices. For example, stadiums and other sports venues are beginning to provide wireless connectivity to the event goers for the price of admission in order to enhance the user experience and promote return business.

Figure 1:
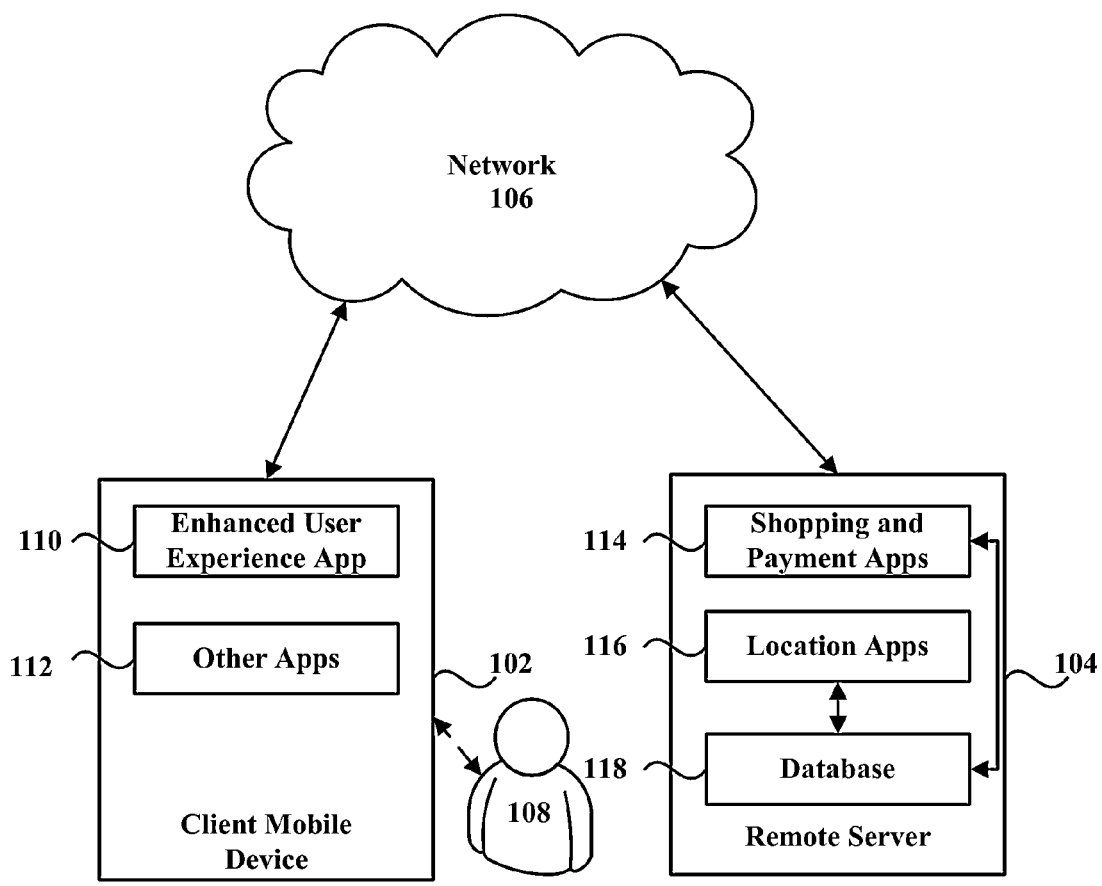
FIG. 1 is a screenshot of a home screen of an enhanced user experience application executing on a user mobile device, consistent with some embodiments.

In the drawings, elements having the same designation have the same or similar functions.

DETAILED DESCRIPTION

In the following description specific details are set forth describing certain embodiments. It will be apparent, however, to one skilled in the art that the disclosed embodiments may be practiced without some or all of these specific details. The specific embodiments presented are meant to be illustrative, but not limiting. One skilled in the art may realize other material that, although not specifically described herein, is within the scope and spirit of this disclosure.

Consistent with some embodiments, there is provided a method for providing venue-specific location-based services to a user at a venue including steps of requesting one or more venue-specific location-based services, the services being specific to the venue, capturing at least one of a venue locator from the user and a geographic location from the user as a user locator, and transmitting the requested one or more venue-specific location-based services and the user locator. In some embodiments, the method may be embodied in computer-readable media.

Consistent with some embodiments, there is further provided a method for providing venue-specific location-based services to a user at a venue. The method includes steps of receiving at least one of a venue locator from the user and a geographic location from the user, receiving a request for a venue-specific location-based service, the requested service being specific to the venue, determining a location of the user based on the at least one venue locator and geographic location, and providing the venue-specific location-based services to the user based on the determined user location. In some embodiments, the method may be embodied in computer-readable media.

FIG. 1 is a block diagram of a networked system 100, consistent with some embodiments. System 100 includes a client mobile device 102 and a remote server 104 in communication over a network 106. User 108 may be communicating and interacting with remote server 104 over network 106 using user device 102. Remote server 104 may be provided by or for an event or venue and may be configured for communicating with client mobile device 102 to provide an enhanced user experience at the event or venue. Network 106, in one embodiment, may be implemented as a single network or a combination of multiple networks. For example, in various embodiments, network 106 may include the Internet and/or one or more intranets, landline networks, wireless networks, and/or other appropriate types of communication networks. In another example, the network may comprise a wireless telecommunications network (e.g., cellular phone network) adapted to communicate with other communication networks, such as the Internet.

User device 102 maybe a mobile device such as a smartphone, a tablet computer, a laptop or netbooks. User device 102 may also be a personal computer, a set-top box (STB) such as provided by cable or satellite content providers, a video game system console, or a smart or internet-enabled television. User device 102 may also be a head-mounted display (HMD) or other wearable computing device. In some embodiments, user device 102 may be implemented in an automobile, for example in an entertainment center or console of an automobile, or is included or implemented in a healthcare device. User device 102, in one embodiment, may be implemented using any appropriate combination of hardware and/or software configured for wired and/or wireless communication over network 108. Consistent with some embodiments, user device 102 may include any appropriate combination of hardware and/or software having one or more processors and capable of reading instructions stored on a non-transitory machine-readable medium for execution by the one or more processors. Consistent with some embodiments, user device 102 includes a machine-readable medium, such as a memory (not shown) that includes instructions for execution by one or more processors (not shown) for causing user device 102 to perform specific tasks. Some common forms of machine-readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, and/or any other medium from which one or more processors or computer is adapted to read. Instructions stored on the machine-readable media may include instructions for authenticating user device 102 to remote server 106 to access services provided by remote server 106 and/or conducting financial transactions with remote server 106 for purchasing items offered by merchant server 104.

Further, such instructions may also include instructions for displaying content by particular applications or "apps" stored in a memory of user device 102 and executed by one or more processors executing in user device 102. Example applications include an enhanced user experience app 110 that may interact with remote server 104 for providing an enhanced user experience to user 108, and other applications 112. Enhanced user experience application 110 may include a software program, such as a graphical user interface (GUI), executable by one or more processors that is configured to interface and communicate with the remote server 104 or other servers managed by content providers or merchants via network 106. For example, user 108 is able to purchase concessions, order merchandise, play games, find the location of their seat at the event or venue, find the location where they parked, and purchase upcoming tickets. In some embodiments, enhanced user experience application 110 may provide venue-specific location-based services to user 108.

Other apps 112 may provide additional features available to user 108, including a camera application for capturing photographs that may be used by enhanced user experience application 110, a mapping and/or geolocation application for providing and mapping a location that may be used by enhanced user experience application 110, and a scanning application used to scan codes that may be used in various features provided by enhanced user experience application 110. Other apps 112 may also include a browser application implemented as a web browser to view information available over network 106. In some embodiments, the features and functionality provided by enhanced user application app 110 may be provided by a browser. Other applications 112 may also include security applications for implementing client-side security features, programmatic client applications for interfacing with appropriate application programming interfaces (APIs) over network 106 or various other types of generally known programs and/or applications. Other applications 112 may include mobile apps downloaded and resident on client mobile device 102 that enables user 108 to access content through the apps.

Remote server 104 according to some embodiments, may be maintained by the event or venue, or may be provided for the enhanced user experience application 110 to facilitate the functionality provided by enhanced user experience application 110. Remote server 104 may include at least shopping and payment applications 114, which may be adapted to interact with client mobile device 102 over network 106 to process concessions, merchandise, and ticket shopping and purchasing features provided by enhanced user experience application 110. Location applications 116 may be adapted to interact with client mobile device 102 to process location and geofencing features provided by enhanced user experience application 110. Database 118 may include information about the event or venue for providing information related to ticketing, pricing, shopping, concessions, venue maps, seat location, seat details, rosters, news, etc. to location apps 116 and shopping and payment apps 114, as well as client mobile device 102 through enhanced user experience application 110.

Figure 2:
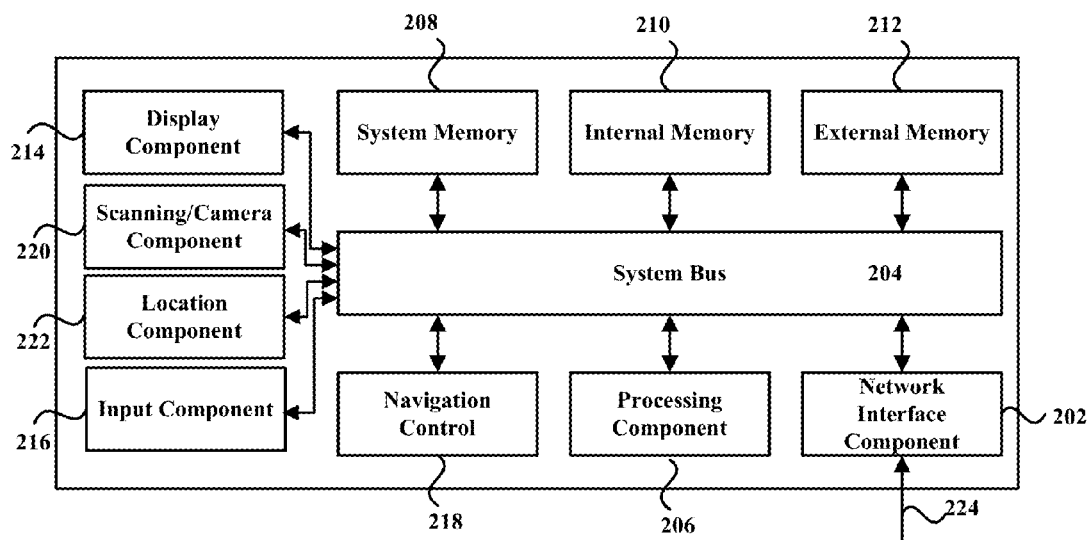
FIG. 2 is a screenshot of a menu for additional content in the enhanced user experience application.

FIG. 2 is a diagram illustrating computing system 200, which may correspond to any of user device 102, merchant server 104, or remote server 106, consistent with some embodiments. Computing system 200 may be a mobile device such as a smartphone, a tablet computer, a laptop or netbooks. Computing system 200 may also be a personal computer, a set-top box (STB) such as provided by cable or satellite content providers, a video game system console, or a smart or internet-enabled television. Computing system 200 may also be a head-mounted display (HMD) or other wearable computing device. In some embodiments, computing system 200 may be implemented in an automobile, for example in an entertainment center or console of an automobile, or is included or implemented in a healthcare device. Further, computing system 200 may also be a server or one server amongst a plurality of servers. As shown in FIG. 2, computing system 200 includes a network interface component (NIC) 202 configured for communication with a network such as network 108 shown in FIG. 1. Consistent with some embodiments, NIC 202 includes a wireless communication component, such as a wireless broadband component, a wireless satellite component, or various other types of wireless communication components including radio frequency (RF), microwave frequency (MWF), near field communication (NFC), and/or infrared (IR) components configured for communication with network 108. Consistent with other embodiments, NIC 202 may be configured to interface with a coaxial cable, a fiber optic cable, a digital subscriber line (DSL) modem, a public switched telephone network (PSTN) modem, an Ethernet device, and/or various other types of wired and/or wireless network communication devices adapted for communication with network 108.

Consistent with some embodiments, computing system 200 includes a system bus 204 for interconnecting various components within computing system 200 and communication information between the various components. Such components include a processing component 206, which may be one or more processors, micro-controllers, or digital signal processors (DSP), graphics processing units (GPUs), a system memory component 208, which may correspond to random access memory (RAM), an internal memory component 210, which may correspond to read-only memory (ROM), and an external or static memory 212, which may correspond to optical, magnetic, or solid-state memories. Consistent with some embodiments, computing system 200 further includes a display component 214 for displaying information to a user 110 of computing system 200. Display component 214 may be a liquid crystal display (LCD) screen, an organic light emitting diode (OLED) screen (including active matrix AMOLED screens), an LED screen, a plasma display, or a cathode ray tube (CRT) display. Computing system 200 may also include an input component 216, allowing for user 110 of computing system 200 to input information to computing system 200. Such information could include payment information such as an amount required to complete a transaction, account information, authentication information, or identification information. An input component 216 may include, for example, a keyboard or key pad, whether physical or virtual. Computing system 200 may further include a navigation control component 218, configured to allow a user to navigate along display component 214. Consistent with some embodiments, navigation control component 218 may be a mouse, a trackball, or other such device. Moreover, if device 200 includes a touch screen, display component 214, input component 216, and navigation control 218 may be a single integrated component, such as a capacitive sensor-based touch screen or other touch screen. Further consistent with some embodiments, computing system 200 may include a scanning and camera component 220. Scanning and camera component 220 may be any mechanism that allows for the capture of images and scanning of bar, QR, or other codes.

Consistent with some embodiments, computing system 200 may include a location component 222 for determining a location of computing system 200. In some embodiments, location component 222 may correspond to a Global Positioning System (GPS) transceiver that is in communication with one or more GPS satellites. In other embodiments, location component 222 may be configured to determine a location of computing system 200 by using an internet protocol (IP) address lookup, or by triangulating a position based on nearby mobile communications towers. Location component 222 may be further configured to store a user-defined location in any of system memory 208, internal memory 210, and/or external memory 212 that can be transmitted to a third party for the purpose of identifying a location of computing system 200. In some embodiments, location component 222 may be configured to determine one or more GPS coordinates representing a location of computing system 200 and, in some cases, user 108, which may be provided to remote server 104 for obtaining venue-specific location-based services.

Computing system 200 may perform specific operations by processing component 206 executing one or more sequences of instructions contained in system memory component 208, internal memory component 210, and/or external or static memory 212. In other embodiments, hard-wired circuitry may be used in place of or in combination with software instructions to implement the present disclosure. Logic may be encoded in a computer readable medium, which may refer to any medium that participates in providing instructions to processing component 206 for execution. Such a medium may take many forms, including but not limited to, non-volatile media, volatile media, and transmission media. The medium may correspond to any of system memory 208, internal memory 210 and/or external or static memory 212. Consistent with some embodiments, the computer readable medium is non-transitory. In various implementations, non-volatile media include optical or magnetic disks, volatile media includes dynamic memory, and transmission media includes coaxial cables, copper wire, and fiber optics, including wires that comprise system bus 204. According to some embodiments, transmission media may take the form of acoustic or light waves, such as those generated during radio wave and infrared data communications. Some common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

In various embodiments of the present disclosure, execution of instruction sequences to practice the present disclosure may be performed by computing system 200. In various other embodiments of the present disclosure, a plurality of computing systems 200 coupled by a communication link 224 to network 106 (e.g., such as a LAN, WLAN, PTSN, and/or various other wired or wireless networks, including telecommunications, mobile, and cellular phone networks) may perform instruction sequences to practice the present disclosure in coordination with one another. Computing system 200 may transmit and receive messages, data and one or more data packets, information and instructions, including one or more programs (i.e., application code) through communication link 224 and network interface component 202. Communication link 224 may be wireless through a wireless data protocol such as Wi-Fi™, 3G, 4G, HSDPA, LTE, RF, NFC, or through a wired connection. Network interface component 202 may include an antenna, either separate or integrated, to enable transmission and reception via communication link 224. Received program code may be executed by processing component 206 as received and/or stored in memory 208, 210, or 212.

Computing system 200 may include more or less components than shown in FIG. 2 according to some embodiments. Moreover, components shown in FIG. 2 may be directly coupled to one or more other components in FIG. 2, eliminating a need for system bus 204. Furthermore, components shown in FIG. 2 may be shown as being part of a unitary system 200, but may also be part of a system where the components are separate but coupled and in communication. In general, the components shown in FIG. 2 are shown as examples of components in a computing system 200 capable of performing embodiments disclosed herein. However, a processing system 200 may have more or fewer components and still be capable of performing some embodiments disclosed herein.

Figure 3:
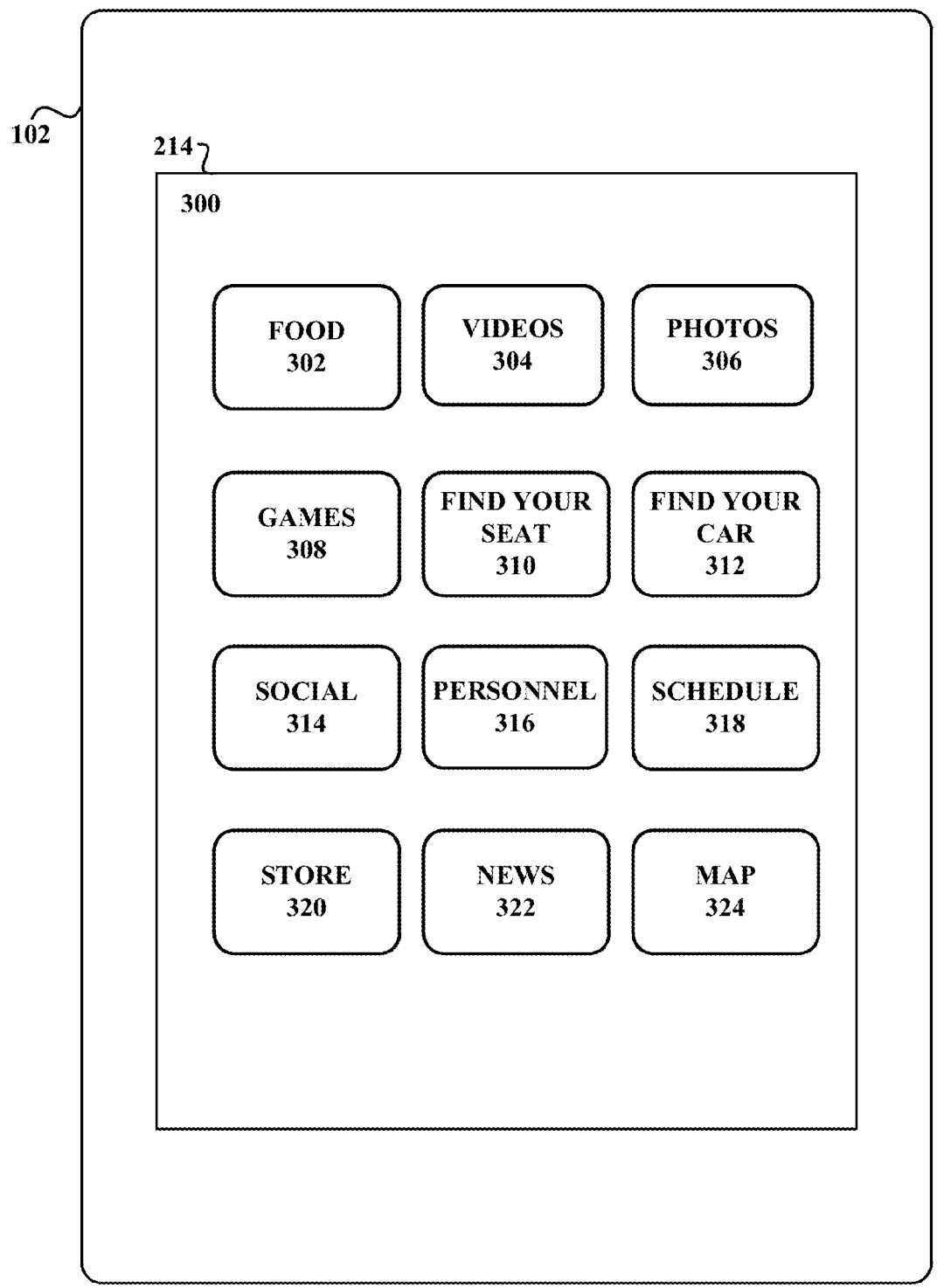
FIG. 3 is a diagram illustrating a user interface of an enhanced user experience application, consistent with some embodiments.

FIG. 3 is a diagram illustrating a user interface 300 of an enhanced user experience application, consistent with some embodiments. As shown in FIG. 3, display component 214 of client mobile device 102 may be capable of display user interface 300 that includes a menu of features provided by enhanced user experience application 110. In some embodiments, the items displayed in the menu of features may be icons which may correspond to links that, when selected, provide user 108 with additional options and features related to the selected links. As shown in FIG. 3, an example menu displayed in user interface 300 may include links for having food delivered 302 to a seat of user 108. Interface 300 may also include a link for viewing videos of or related to the event 304 on client mobile device 102. For example, selecting link 304 may open a video menu allowing user 108 to view videos about the event or of the event. In some embodiments, the videos may be a live broadcast of the event. In some embodiments, the videos may be hosted on a third party video sharing site such as YouTube, or a server maintained or provided for the event or venue. In other embodiments, the video content may be hosted on a server associated with an event partner. The videos provided to user 108 may include an instant replay from the current event, links to view the same video feed that is viewed on the Jumbotron or other large video screen maintained at the event or venue, links to video from previous events, links to view content from associated events, and links to a backstage video feed for concerts or other stage performances. In some embodiments, link 304 may provide other media as well as video, such as live audio streaming from a live radio broadcast.

Interface 300 may also include links for viewing photos 306 related to the event. Selecting link 306 from interface 300 may present user 108 with photos that have been taken by other attendees of the event or venue and uploaded to a server associated with the event or venue. Alternatively, the server may be associated with enhanced user experience application 110, such that the photos available through the interface may only be available to users using enhanced user experience application 110. Consistent with some embodiments, users may be able to vote on the pictures and/or designate the pictures as being favorites. In some embodiments, users may win prizes for having the best photo, and the fan photos may be shown on the Jumbotron or other large screen provided by the event or venue.

Interface 300 may also include a link for games 308 related to the venue or event that may be played by user 108. In some embodiments, users may play games related to the event or venue and compete with other users at the event or venue. Such games may include guessing the next play or the final score, if the event is a sporting event. User 108 may have their seat location, username, or other indicia shown on the Jumbotron or other screen provided at the event or venue indicating their score, the correct answer. Winners may be declared for certain games throughout the event and may be provided with rewards such as discounts on the user's next visit to the venue. Games may also include trivia games, sporting games, and other games of chance and/or skill.

The example menu in user interface 300 may also include links for venue-specific location-based services, such as finding a seat 310 of user 108 at the venue, and locating a vehicle 312 of user 108 at the event or venue. The example menu in user interface 300 may also include social options 314, where user 108 may be able to chat or message other users at the event or venue. Social options 314 may also be integrated with third party social networks such as Facebook™, Twitter™, Google+™, Pinterest™, Tumblr™ and the like, allowing user 108 to share their experiences, photos, and other content from the event or venue and receive social updates from the event for venue. Social options may also be integrated Foursquare™ or PayPal™ check in here, to allow user 108 to check into the venue or event. Social options may also include a group chat functionality In some embodiments, the social options 314 may include a group chat that may link all users 108 of enhanced user experience application 110 at the event or venue. The group chat functionality may provide users with the ability to keep in touch while at the event or venue. Users 108 may create subgroups within the group chat functionality including inviting other users 108, and blocking user 108 who are being abusive or detrimental to the experience of other users 108. Social options 314 may also provide user 108 with the ability to send a short messaging service (SMS) or other message to remote server 104 that, when received, may be displayed on the Jumbotron or other large display at the event or venue. Social options 314 may also provide user 108 the ability to participate in event or venue-wide polls and other social participation activities.

The example menu in user interface 300 may also include a link to a personnel page 316. Selecting personnel page link or icon 316 may provide user with information about the team or teams (home and visitors), band, orchestra, or other performers, performing at the event or venue. The provided information may include a team roster along with position and other information, a listing of the band or orchestra members along with their instruments, a listing of the performers and their biographies, statistics, a set list, recommendations to similar performers, ratings and reviews of the performers, when the performer had last played, and other such information. In some embodiments, user 108 may be able to select a listed person and make them a favorite, view additional information about the listed person, and/or purchase merchandise related to the listed person. For example, user 108 may select a player on a team at the event or venue and be provided with merchandise options related to that player from a merchant or marketplace, such as provided by eBay, Inc. of San Jose, Calif.

The example menu in user interface 300 may also include a link to a schedule 318. Selecting schedule 318 may provide user 108 with information regarding the upcoming schedule of the performer performing at the event or venue, team playing, and/or the upcoming schedule of the events happening at the venue. From the provided information, user 108 may be able to select a future event or performance and be provided additional information about the future event or performance. User 108 may be able to view additional options regarding upcoming events and/or performances, such as if an upcoming event is to be broadcast on television, radio, or over the internet, and information related to such broadcasts. Moreover, user 108 may be able to purchase tickets to a future event or performance using a ticket purchase interface (not shown). In some embodiments, the ticket purchasing functionality may be provided by a ticket provider such as StubHub, Inc. of San Francisco, In some embodiments, user interface 300 may also include a separate link or icon for purchasing tickets (not shown). A ticket purchase interface that may include options for purchasing tickets for upcoming events at the venue, or upcoming events involving the performers or team of the current event along with options for buying single event tickets or multiple event tickets. Selecting an event or ticket option of interest may bring up pricing options for the selected event or ticket option. Details regarding the ticket that the user is considering purchasing may also be provided to user 108 through enhanced user experience application 110. The details may include a view from a selected seat or a seat map provided by the event or venue, through a ticket service provider such as StubHub, Inca of San Francisco, Calif., or through a third party such as SeatData.com of Las Vegas, Nev. Based on the provided details, user 108 may decide whether they want to purchase the ticket or browse for another ticket having more desirable details.

The example menu in user interface 300 may also include a link to a store 320 or shop associated with the event or venue. Selecting the link to store 320 may provide user 108 with merchandise available for purchase related to the event or venue. For example, the merchandise may include compact discs (CDs), digital video discs (DVDs), books, and team-related equipment and merchandise. The provided merchandise may be listed for user 108 to view and select for further information and purchase. In some embodiments, the merchandise may be available from a retailer at the event or venue, and an inventory of the merchandise provided by the retailer may be viewable by user 108. In some embodiments, the inventory may be provided by Milo of San Jose, Calif. User 108 may be able to select merchandise for purchase, and pay for the merchandise using a payment service provider, such as PayPal, Inc. of San Jose, Calif. In some embodiments, purchased merchandise may be available for user 108 to pick up at the retailer or a designated area at the event or venue. In other embodiments, purchased merchandise may be available for delivery to the seat of user 108.

The example menu in interface 300 may also include an icon and/or link to a news section 322. Selecting news section 322 may provide user 108 with news related to the event or venue. The news may include such information as scores, program notes, performance updates, notices of upcoming performances or events, and the like. News section 322 may also include a live scoreboard, play-by-play updates for a sporting event, statistics, standings, and injuries and other event or venue-related news. News section 322 may also be configurable to provide push notifications or alerts providing relevant news to user 108.

In some embodiments, interface 300 may include a map 324 link which may provide a map and directory of the venue and allow user 108 to find facilities and vendors throughout the stadium, which may be displayed on display component 214 of client mobile device 102. User 108 may select a vendor or facility (e.g., restrooms, concession stands, vendors, automatic teller machines (ATMs), and the like) and a map may be provided to user 108 based on a venue locator, which may be a location of user 108 as determined by location component 222 of client mobile device 102 or by user scanning a code on a ticket of user 108, or scanning a venue marker. In some embodiments, user 108 may be able to select a vendor or facility from the displayed map to view the food or merchandise available for purchase or delivery instead of selecting link 302 or 320 from the menu of user interface 300. In some embodiments, geofencing may be used based on the location of user 108 to provide offers, menus, and other features to user 108 when they are in a certain location. In some embodiments, user 108 may be able to user map 324 link to also view lines and wait times at facilities and vendors to make informed decisions as to which facility or vendor to visit. Map 324 link may also provide user 108 with a map to the event or venue along with best traffic routes. Map 324 link may also provide user with an option to see parking options, parking availability, and even make parking reservations using enhanced user experience application 110. Mapping functionality provided by map 324 link may be provided by a third party.

The icons and/or links shown in interface 300 are just examples of links and/or icons that may be provided as part of an enhanced user experience application 110. Indeed, enhanced user experience application 110 may be tailored by providers of the event or venue, or user 108 through settings, to provide more or less features for selection, viewing, and interaction, in order to enhance the experience of user 108 while at the event or venue. Although not shown in FIG. 3, enhanced user experience application 110 may include links for other features that may enhance the experience of user 108 at an event or venue. For example, enhanced user experience application 110 may provide an augmented reality experience for user 108 using scanning/camera component 220, wherein user 108 may use scanning/camera component 220 to capture one or more images of a scoreboard, poster, retired numbers, or other information around the event or venue that will be analyzed using known object recognition algorithms and augmented reality features, and will be provided with additional information related to the object. For example, if user 108 points scanning/camera component 220 at the scoreboard at the event or venue, enhanced user experience application 110 may employ object recognition to recognize using the opposing team and provide user 108 with links related to the opposing team. Or, user 108 could point scanning/camera component 222 at a retired number which would bring up information related to the player that used to wear that number.

Further, user 108 may be able to use the application to keep updates on their fantasy sports team while at an event or venue, which in some embodiments, may be a sports event and sports venue. User 108 may be able to enter the players that are on one or more of their fantasy sports teams and the application may be able to receive near real-time updates from the event, the venue, or a statistics provider licensed by an entity associated with the event or venue that the application is able to parse into scores for the fantasy players entered by user 108.

In addition, enhanced user experience application 110 may be used to listen to, augment, or provide an indication of a level of crowd noise. For example, user 108 may be able to augment the crowd noise with a sound or song that is made by enhanced user experience application 110 and emitted through a speaker of client mobile device 102, such as a horn or vuvuzela. Similarly, if there are songs that are sung by the crowd, enhanced user experience application 110 may provide user 102 with the music and lyrics to the songs. Enhanced user experience application 110 may receive a live feed from one of the noise meters that are shown on the Jumbotron or other large screen during games to see in near real-time how loud the crowd is. Similarly, if user 108 is at a concert, enhanced user experience application 110 may be able to provide lyrics to current songs being performed.

Figure 4:
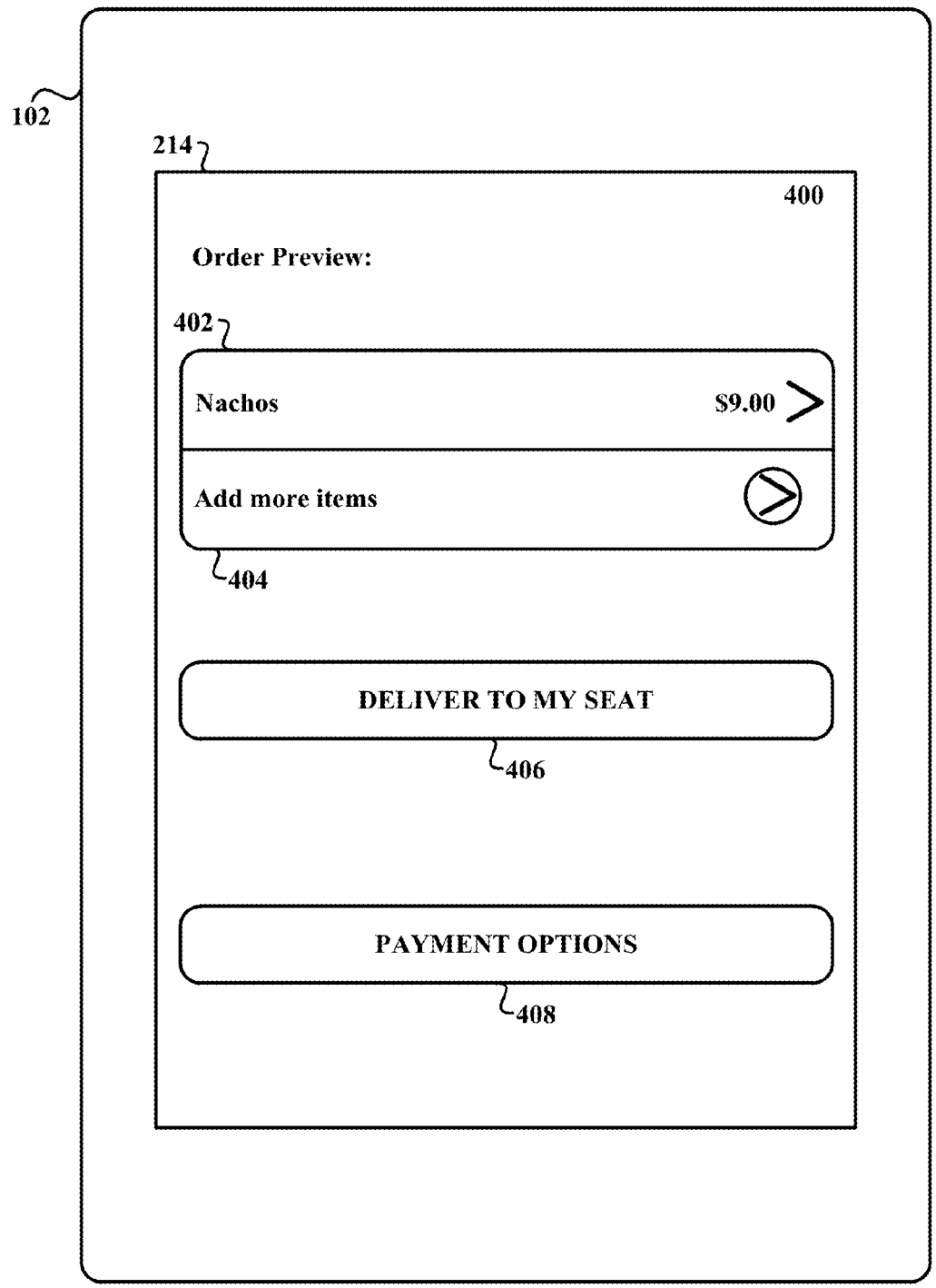
FIG. 4 is a diagram illustrating an interface for ordering food provided by an enhanced user experience application, consistent with some embodiments.

FIG. 4 is a diagram illustrating an interface 400 for ordering food provided by an enhanced user experience application, consistent with some embodiments. As discussed above, user 108 may select an icon or link for ordering food 302 using enhanced user experience application 110. Upon selecting icon or link for ordering food 302, user 108 may be presented with a menu of food items, drinks, and other concessions available for purchase by user 108. The menu of food items, drinks, and other concessions may also include tailgate packages that can be provided to tailgating event goers. Once user 108 selects the food and drinks for purchase, user 108 may be presented with interface 400 such as shown in FIG. 4 for purchasing and delivering the selected food and drinks. In some embodiments, interface 400 may provide user 108 with an order preview 402 showing the selected food and drinks along with a price of the selected food and drinks. Interface 400 may also provide user 108 with a selection 404 for selecting additional items that, when selected, may bring user 108 back to the menu of food and drinks available.

In some embodiments, interface 400 may also include a selection for seat delivery 406, wherein user 108 can provide their seat and have the selected food and drinks delivered to their seat. Using the entered seat number, the vendor may match the seat number to a map of the event or venue and be able to locate user 108 and deliver the purchased food items to the seat of user 108. Alternatively, as shown in FIG. 4, user 108 may be able to scan a code, such as a bar code or a Quick Response (QR) code printed on their ticket, or a code on a venue marker near them, such as on a back of a seat or a lamppost in the venue or event, using a scanning/camera component 220 to provide the vendor the user's seat information for delivery of the ordered concessions to the user's seat. Alternatively, the scanning application may apply image recognition or optical character recognition on the scanned ticket to recognize the user's seat location. This seat information may then be provided to the vendor for matching to a map of the venue so that the seat of user 108 may be identified and the purchased items may be delivered to the seat of user 108. In some embodiments, location component 222 of client mobile device 102 may be able to determine a current geographical location of user 108 and provide this information to the vendor. Interface 400 may also provide a payment option 408 for paying for the selected food and drinks. In some embodiments, payment option 408 may allow a user to pay through a payment service provider such as PayPal, Inc. of San Jose, Calif.

Figure 5A:
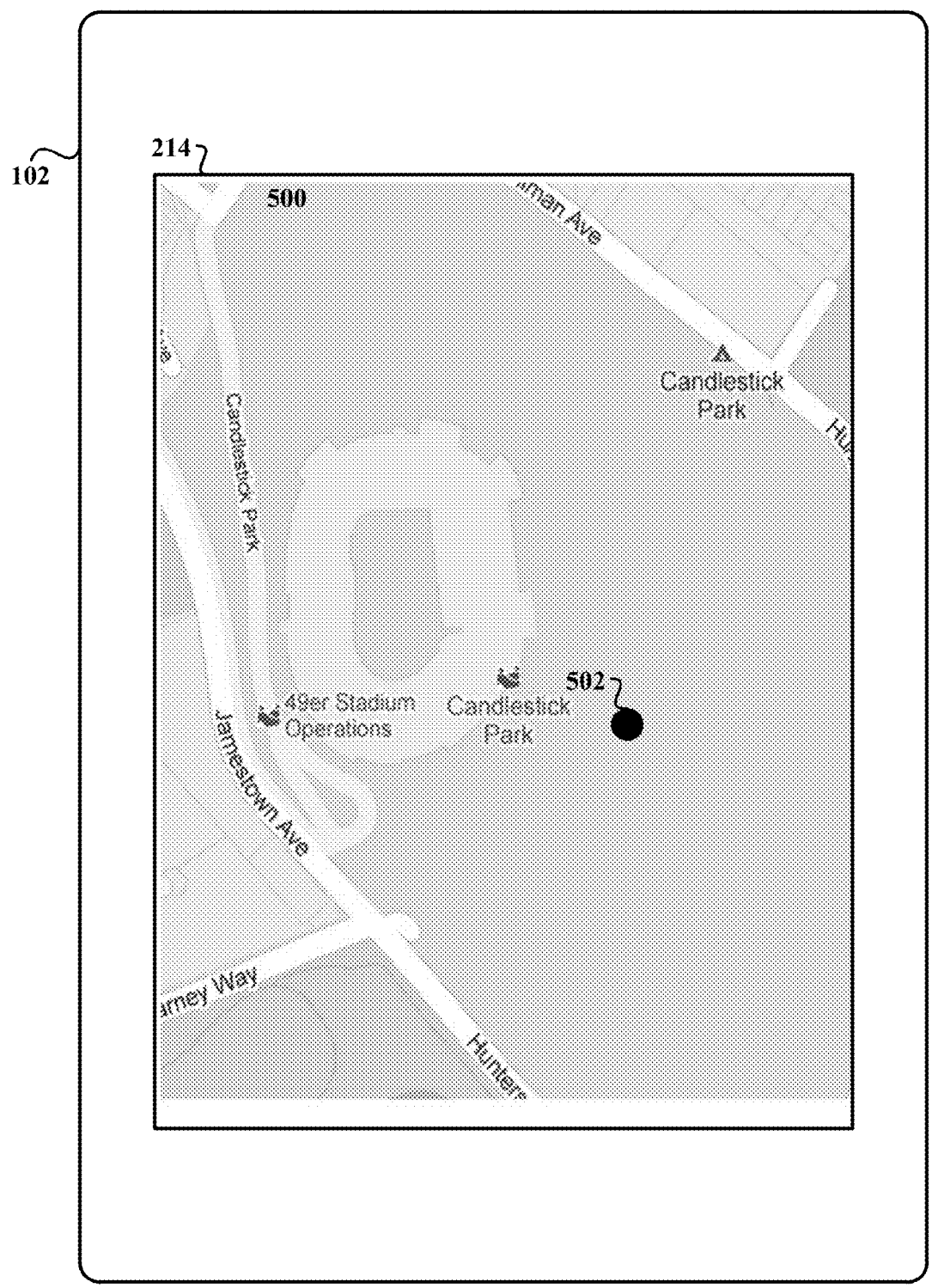
FIGS. 5A-5C are diagrams illustrating an interface for finding a seat of a user using the enhanced user experience application, consistent with some embodiments.
Figure 5B:
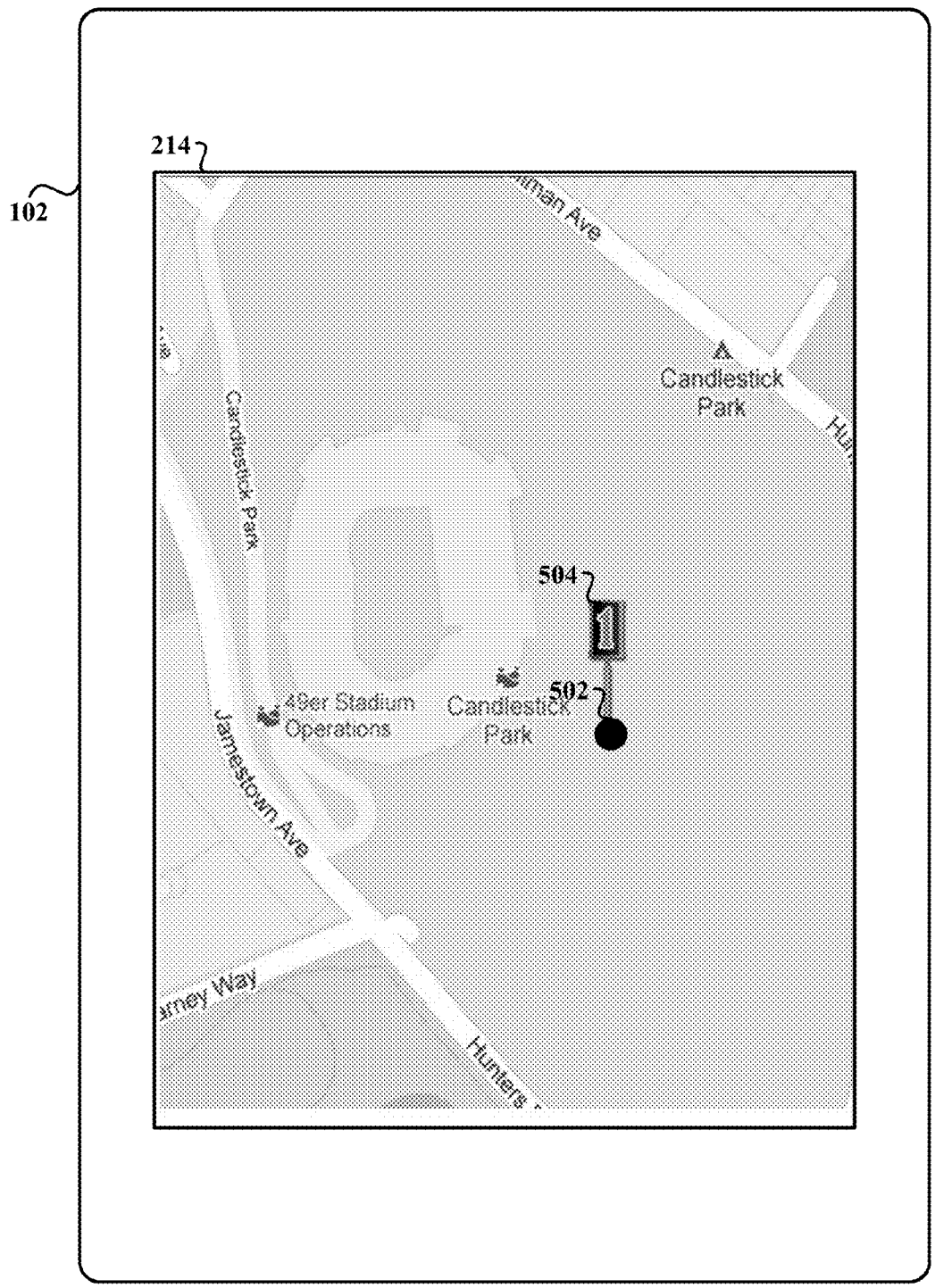
Figure 5C:
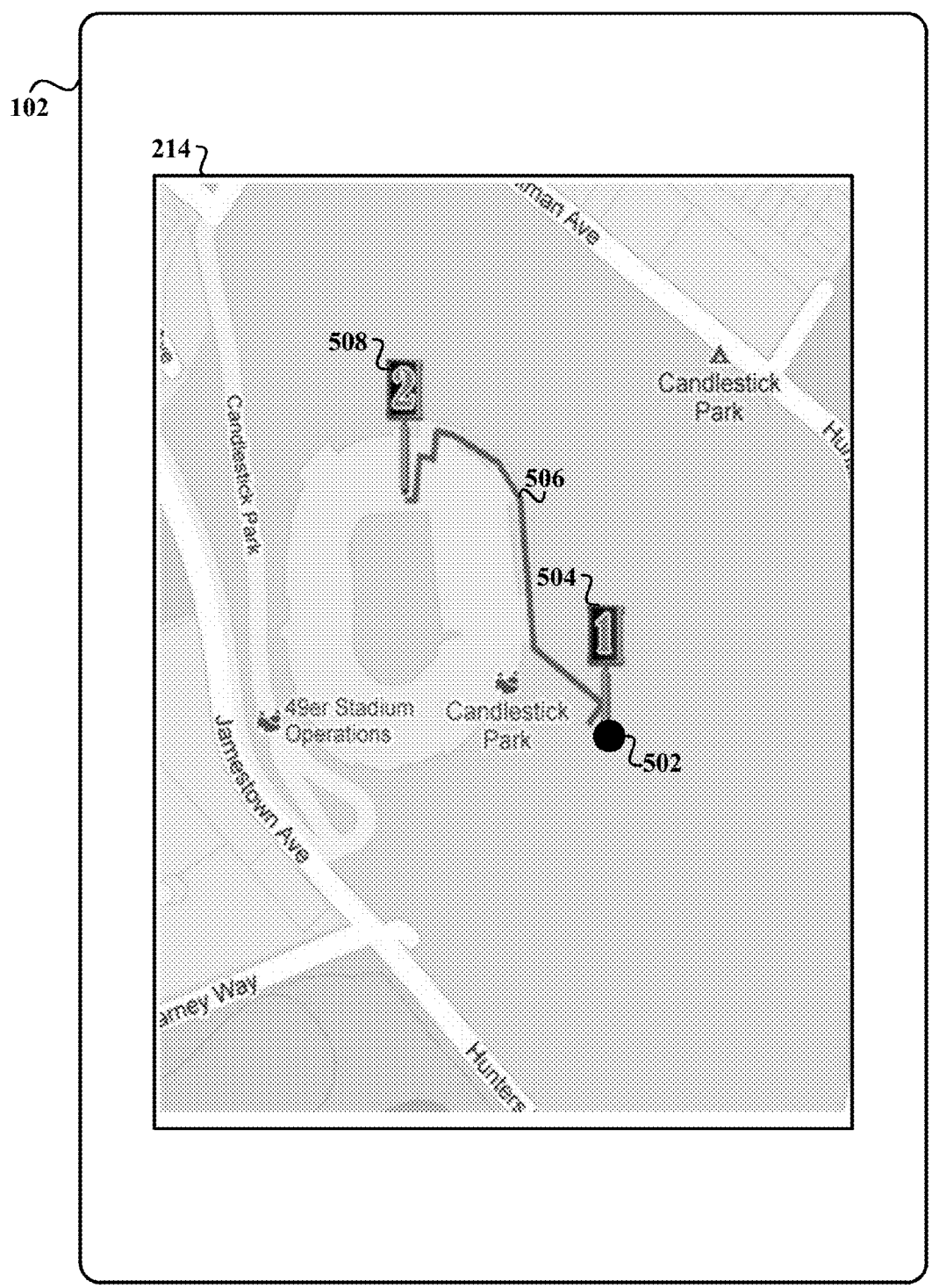

FIGS. 5A-5C are diagrams illustrating an interface for finding a seat of user 108 using the enhanced user experience application 110, consistent with some embodiments. As discussed above, user may select the link for finding their seat 310 from interface 300 of enhanced user experience application 110. In some embodiments, selecting link for finding your seat 310 may allow user 108 to locate their seat within the event or venue and, in some embodiments, and locate their car from the event or venue. Selecting the icon or link for finding your seat 310 may provide user 108 with a prompt to scan or take a picture of a code printed on their ticket, or on a venue or event marker, such as a code placed on a nearby seat or lamppost in the parking lot using scanning/camera component 220. The scanned code or captured picture may be processed by processing component 206 and transmitted to remote server 104, where the received code or picture may be matched to the location of a corresponding seat for user 108 within the event or venue. In some embodiments, a geographic location of user 108 may be determined using location component 222, and this information may also be provided to remote server 104. Remote server 104 may then process the corresponding seat of user and a current location of user 108 to determine a route to the seat. The route may then be transmitted to client mobile device 102 for display on display component 214 as a map to the seat. The route may indicate the closest gate to the user or the closest gate to the user's seat. In some embodiments, remote server 104 may provide the seat location to client mobile device 102 and enhanced user experience application 110 may determine the route to the seat from a current location of user 108, which may be displayed on display component 214 as a map. That is, in some embodiments, enhanced user experience application 110 may store location information about the venue or event, and the processing of location-based requests may be performed by processing component 206 of client mobile device 102. In such embodiments, the location information may be received from remote server 104.

In some embodiments, a determined location of user 108 may be saved in client mobile device 102 or in remote server 104 as an indication of where user 108 parked, such that after the event has concluded, user 108 can access the enhanced user experience application 110 to get a map back to their parked vehicle. As shown in FIG. 5A, user may be presented with a map 500 of the event or venue, that also shows the location 502 of user 108. User 108 may then be prompted to scan or take a picture of a code printed on their ticket, or on a venue or event marker, such as a code placed on a nearby seat or lamppost in the parking lot using scanning/camera component 222, or manually enter this information. As shown in FIG. 5B, a marker 504 may be applied to map 500 that shows where user 108 currently is. In some embodiments, marker 504 may mark a parking location of user 108 for user to user after the event and leaving the venue. In some embodiments marker 504 may be shown as a venue or event related marker, such as a down marker for an American football event, or a guitar for a rock concert. As shown in FIG. 5C, a route 506 from a location 502 of user 108 to their seat 508 may be presented to user 108. In some embodiments, map 324 link may provide similar functionality allowing user 108 to be presented with a route from their current location to a selected facility or vendor, and such functionality may be provided similarly to the examples shown in FIGS. 5A-5C.

Figure 6A:
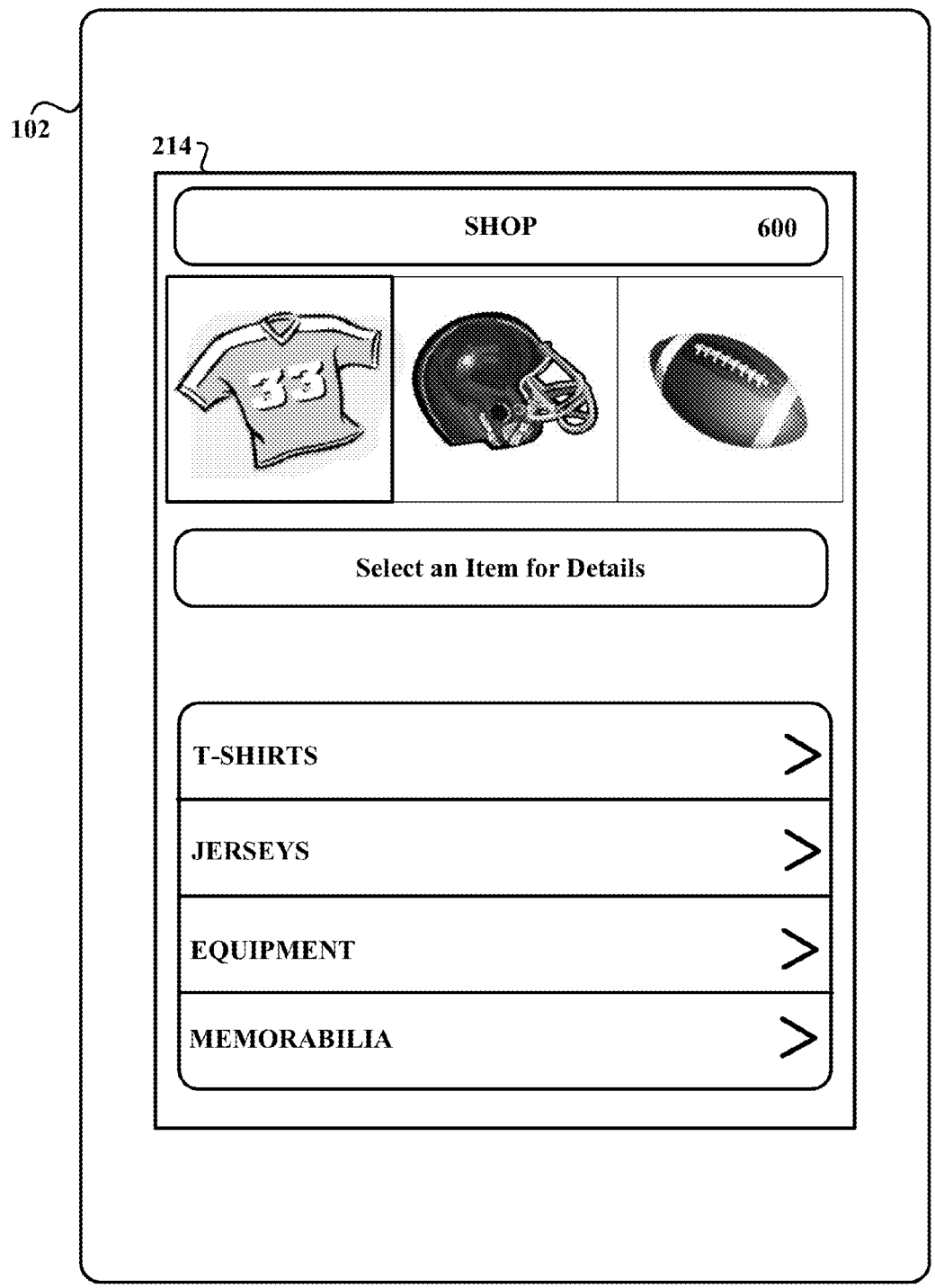
FIGS. 6A-6C are diagrams illustrating an interface for browsing and purchasing items associated with the event or venue using the enhanced user experience application, consistent with some embodiments.
Figure 6B:
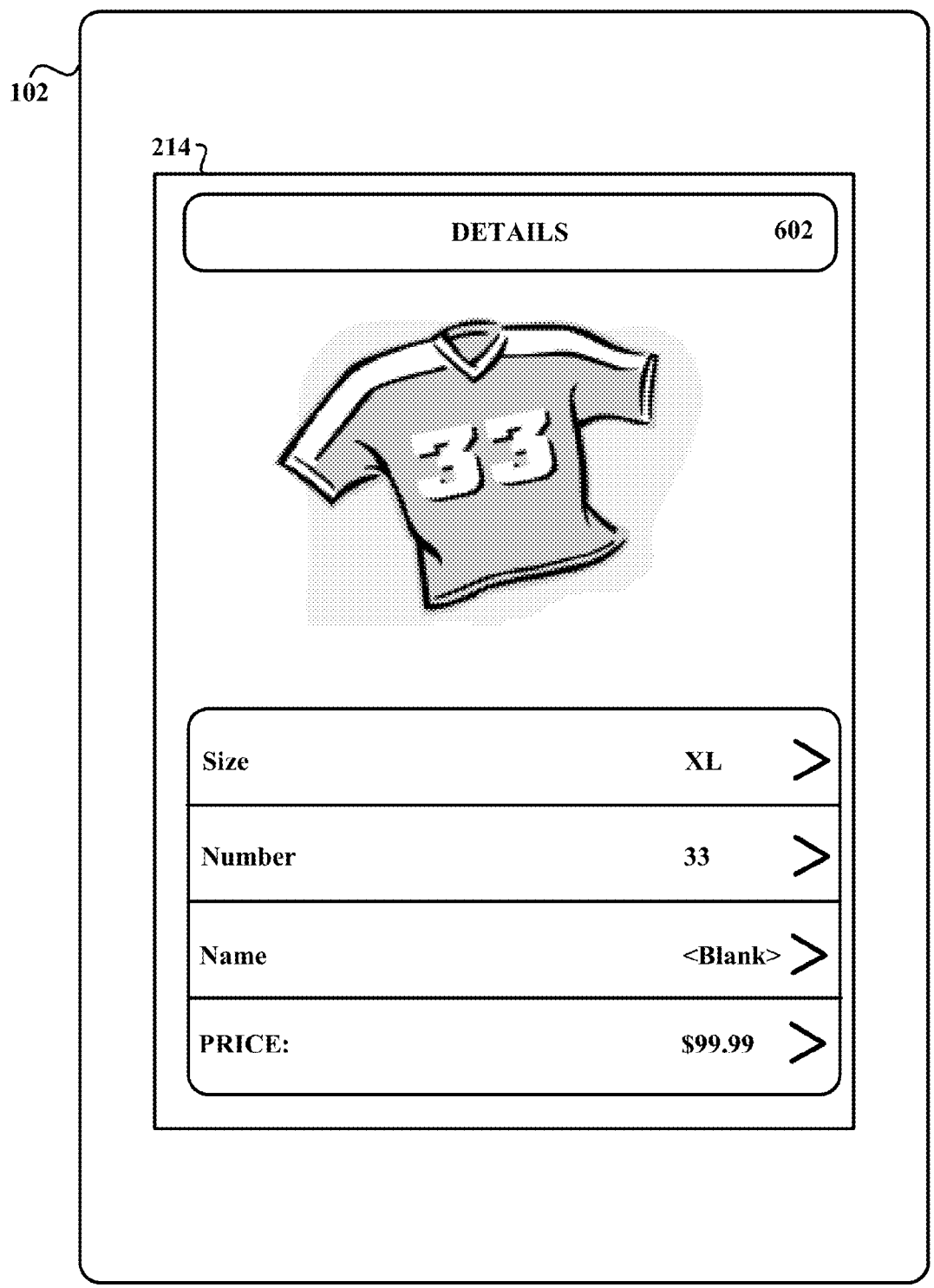
Figure 6C:
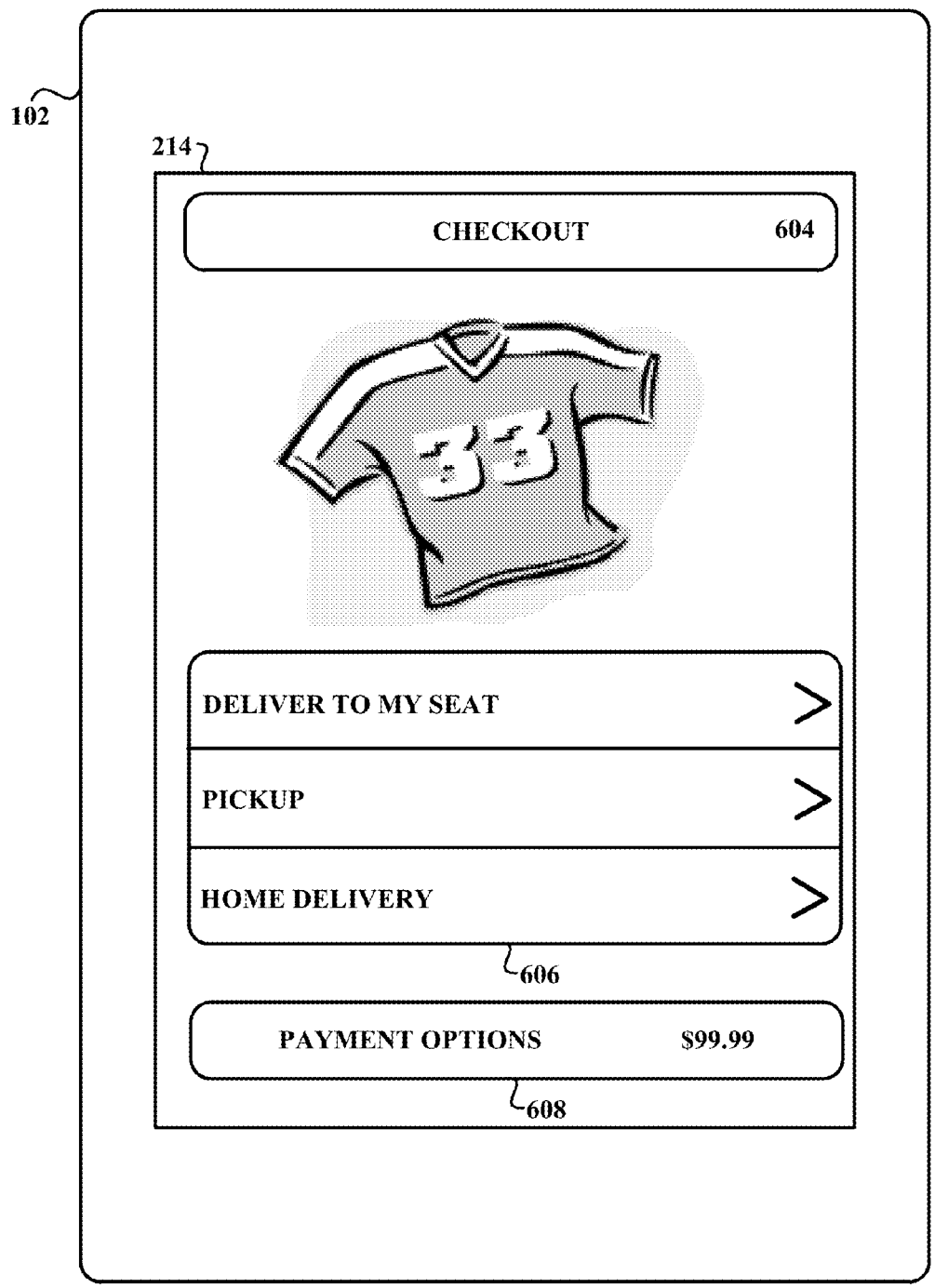

FIGS. 6A-6C are diagrams illustrating an interface for browsing and purchasing items associated with the event or venue using the enhanced user experience application 110, consistent with some embodiments. According to some embodiments, selecting link to a store 320 or shop associated with the event or venue from enhanced user experience application 110 may bring up merchandise related to the event or venue. For example, as shown in FIG. 6A, selecting link or icon 320 may provide user 108 with a display of an interface 600 displaying merchandise related to the event or venue for purchase on display component 214. The example shown in FIG. 6A illustrates merchandise associated with an American football event. However, in other embodiments, the event may be a concert, and merchandise associated with the concert may include t-shirts of the band that is playing, for example. In some embodiments, merchandise displayed in interface 600 on display component 214 may be drawn from a database showing all of the merchandise in inventories available from vendors at the event or venue, with the inventories provided by Milo of San Jose, Calif. Alternatively, the merchandise may be from an outside database, such as from eBay, Inc. of San Jose, Calif.

As shown in FIG. 6B, selecting merchandise from interface 600 may provide a detailed interface 602 that includes a detailed description of selected merchandise, including pricing information, sizing information, and other information related to the selected merchandise. From detailed interface 602 user 108 may be able to select certain features to personalize the merchandise, and prepare an order for the merchandise. Once user 108 has selected the merchandise that they wish to purchase, they may be brought to a checkout screen, such as shown in FIG. 6C.

FIG. 6C is an example of a checkout screen 604, that includes delivery options 606 and payment information 608. As shown in FIG. 6C, user 108 may select delivery options 606 that include delivery of the purchased merchandise to a seat of user 108, pick up at a nearby location in the venue, or home shipment. If user 108 selects the seat delivery option, user may scan a bar or QR code on their event ticket or on a venue marker using a scanning/camera component 222 to send the merchant seat location information of user 108 for delivery of the ordered merchandise. In some embodiments, processing component 206 may apply one or more image recognition or optical character recognition algorithms on one or more captured images of the event ticket or location marker to recognize the user's seat location. In some embodiments, a geographical location of user 108 may be determined by location component 222 and the location information may be provided along with the merchandise order for delivery to the seat of user 108. Payment information 608 may include a link to checkout using a payment service provider such as PayPal of San Jose, Calif. Other payment service providers may be used. Alternatively, options for credit card payments and an option to pay cash on delivery may be displayed as well. If user 108 selects home delivery, user 108 may be prompted to enter a home address, or it may be retrieved from account information associated with user 108. If user selects to pick up the purchased merchandise nearby, a map may be displayed to user 108 on display component 214 illustrating nearby vendors at the event or venue that have the purchased merchandise available for pick up.

Figure 7:
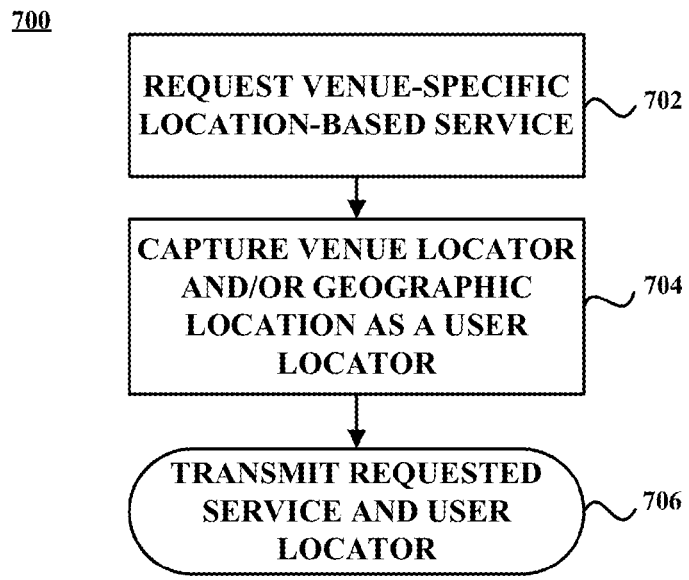
FIG. 7 is a flowchart illustrating a process for requesting venue-specific location-based services, consistent with some embodiments.

FIG. 7 is a flowchart illustrating a process 700 for requesting venue-specific location-based services, consistent with some embodiments. For the purpose of illustration, FIG. 7 may be described with reference to any of FIG. 1-4, 5A-5C, or 6A-6C. Process 700 may be embodied in computer-readable instructions for execution by one or more processors in processing component 206 such that the steps of the method may be performed by client mobile device 102. As shown in FIG. 7, process 700 begins when user 108 requests one or more venue-specific location-based services (702). In some embodiments, user 108 may use enhanced user experience application 110 to request a venue-specific-location-based service, which may include food delivery 302, finding a seat 310, locating a vehicle 312, purchasing tickets from an event or venue schedule 318, purchasing merchandise from a store 320, or accessing a map 324 of the venue or event.

Process 700 may then capture a venue locator and/or a geographic location of user 108 to use as a user locator (704). In some embodiments, a venue locator may be a seat where user 108 is sitting, or a section where the seat is located. The seat may be captured by scanning a code printed on a ticket for the event or venue that user 108 has, or a code on the user's seat or on the back of the seat in front of user's 108 seat using scanning/camera component 220 of client mobile device 102. The seat may also be captured by capturing one or more images of the ticket and performing image recognition on the captured one or more images to determine the seat. The section may be captured by the same methods as capturing the seat. Moreover, the event or venue may have one or more venue markers located throughout the venue that includes codes for scanning by user 108 using scanning/camera component 220 of client mobile device 102. In some embodiments, the geographic location may be captured by location component 222 of client mobile device 102, which may be a GPS transceiver. The requested service and the determined user locator may then be transmitted to remote server 104 for fulfillment (706). Remote server 104 may then fulfill the requested service and provide the requested service to user 108 at the location of user 108.

Figure 8:
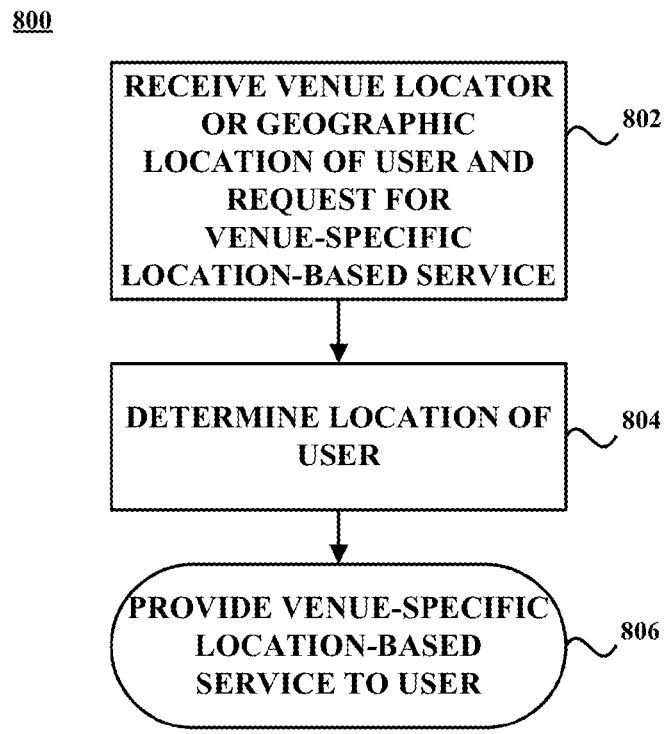
FIG. 8 is a flowchart illustrating a process for providing venue-specific location-based services to a user, consistent with some embodiments.

FIG. 8 is a flowchart illustrating a process 800 for providing venue-specific location-based services to a user, consistent with some embodiments. For the purpose of illustration, FIG. 8 may be described with reference to any of FIG. 1-4, 5A-5C, or 6A-6C. Process 800 may be embodied in computer-readable instructions for execution by one or more processors in processing component 206 such that the steps of the method may be performed by remote server 104. As shown in FIG. 8, process 800 begins when remote server 104 receives at least one of a venue locator or a geographic location of user 108 and a request for a venue-specific location-based service (802). In some embodiments, user 108 may use enhanced user experience application 110 to request a venue-specific-location-based service, which may include food delivery 302, finding a seat 310, locating a vehicle 312, purchasing tickets from an event or venue schedule 318, purchasing merchandise from a store 320, or accessing a map 324 of the venue or event. The request for the venue-specific location-based service may include at least one of a venue locator and/or a geographic location of user 108. In some embodiments, a venue locator may be a seat where user 108 is sitting, or a section where the seat is located, wherein user 108 may scan a code printed on a ticket for the event or venue that user 108 has, or a code on the user's seat or on the back of the seat in front of user's 108 seat using scanning/camera component 220 of client mobile device 102. User may also capture one or more images of the ticket and provide this information to remote server 104 or process locally to determine the seat information for providing to remote server 104. The section may be captured by the same methods as capturing the seat. Moreover, the event or venue may have one or more venue markers located throughout the venue that includes codes for scanning by user 108 using scanning/camera component 220 of client mobile device 102. Furthermore, the geographic location may be obtained by location component 222 of client mobile device 102 and provided to remote server 104.

Based on the received venue locator and/or geographic location, processing component 206 of remote server 104 may determine a location of user 108 (804). In some embodiments, determining a location of user 108 may include matching the received venue locator or geographic location to a map of the event or venue to identify the location of user 108 within the event or venue. Remote server 104 may then provide the requested service to user 108 at the location of user 108 (806).

Figure 9A:
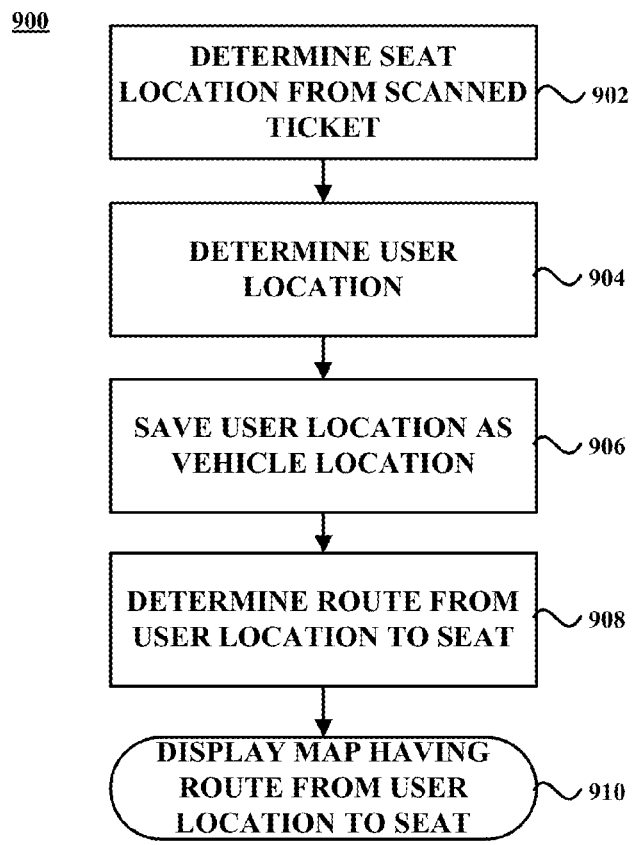
FIGS. 9A and 9B are flowcharts illustrating processes for providing a route to their seat at an event or venue and back again.
Figure 9B:
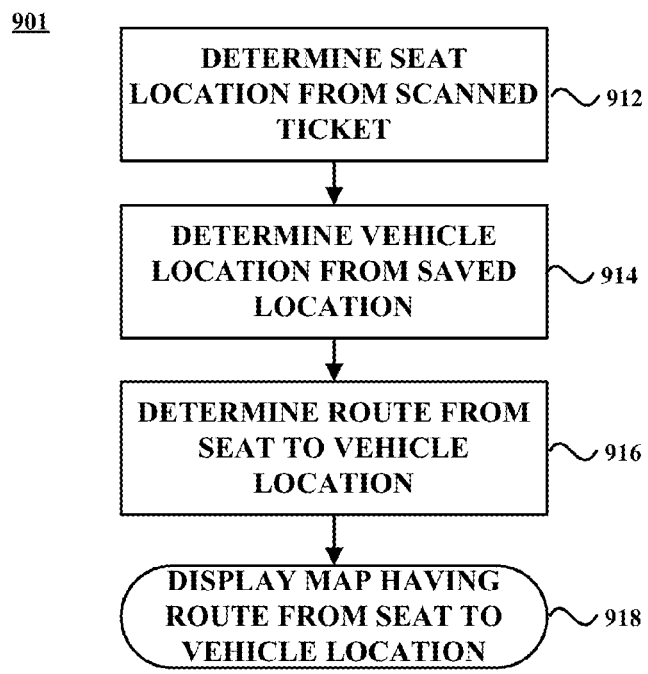

FIGS. 9A and 9B are flowcharts illustrating processes for providing a route to their seat 900 at an event or venue and back again 901. For the purpose of illustration, FIGS. 9A and 9B may be described with reference to any of FIG. 1-4, 5A-5C, or 6A-6C. Processes 900 and 901 may be embodied in computer-readable instructions for execution by one or more processors in processing component 206 such that the steps of the method may be performed by client mobile device 102, remote server 104, or a combination thereof. Processes 900 and 901 may be accessed by links 310 and 312 of enhanced user experience application 110. As shown in FIG. 9A, process 900 begins determine a seat location of a seat of user 108 from scanning a ticket (902). Consistent with some embodiments, user 108 using client mobile device 102 having a scanning/camera component 220 may scan a QR, bar, or other code from a ticket, or take one or more images of the ticket for optical character recognition (OCR), to obtain seat data. The seat data from the scanning/imaging may be transmitted to remote server 104 to determine the seat location using location applications 116 in combination with database 118. In some embodiments, enhanced user experience application 102 may determine the seat location based on the seat data. A location of user 108 may then be determined (904). In some embodiments, the location of user 108 may be determined using location component 222 of client mobile device 102. Alternatively, the location of user 108 may be determined by scanning a code imprinted on an venue or event marker, such as on a lamppost in the parking lot. The determined location may be sent to remote server 104 or stored locally in one of memories 208, 210, or 212. In some embodiments, the determined location is also saved as the vehicle location (906). Again, this may be stored locally or on remote server 104 or both. A route from the determined user location to the determined seat location may then be determined (908). The route may be determined by processing component 206 on either client mobile device 102, remote server 104, or both. A map showing the determined route from the determined user location to the determined seat location may then displayed to user 108 (910). Consistent with some embodiments, the map may be displayed on client mobile device 102 as part of enhanced user experience application 110 using display component 214.

FIG. 9B provides a process 901 for providing a route to a user's vehicle from their seat, consistent with some embodiments. First, the seat location is determined from a scanning a ticket (912). Consistent with some embodiments, user 108 using client mobile device 102 having a scanning/camera component 220 may scan a QR, bar, or other code from a ticket, a seat, a lamppost, or other event or venue marker, or OCR the seat information on the ticket to obtain seat data. The seat data from the scanning/imaging may be transmitted to remote server 104 to determine the seat location using location applications 116 in combination with database 118, or may be determined locally by enhanced user experience application 110. Next, a vehicle location may be determined from the saved vehicle location from step 906 in FIG. 9A (914). The saved location may be stored locally or on remote server 104 or both. A route from the determined seat location to the saved vehicle location may then be determined (916). The route may be determined by processing component 106 on either client mobile device 102, remote server 104, or both. A map showing the determined route from the determined seat location to the saved vehicle location may then displayed to user 108 (918). Consistent with some embodiments, the map may be displayed on client mobile device 102 as part of enhanced user experience application 110 using display component 214.

Figure 10:
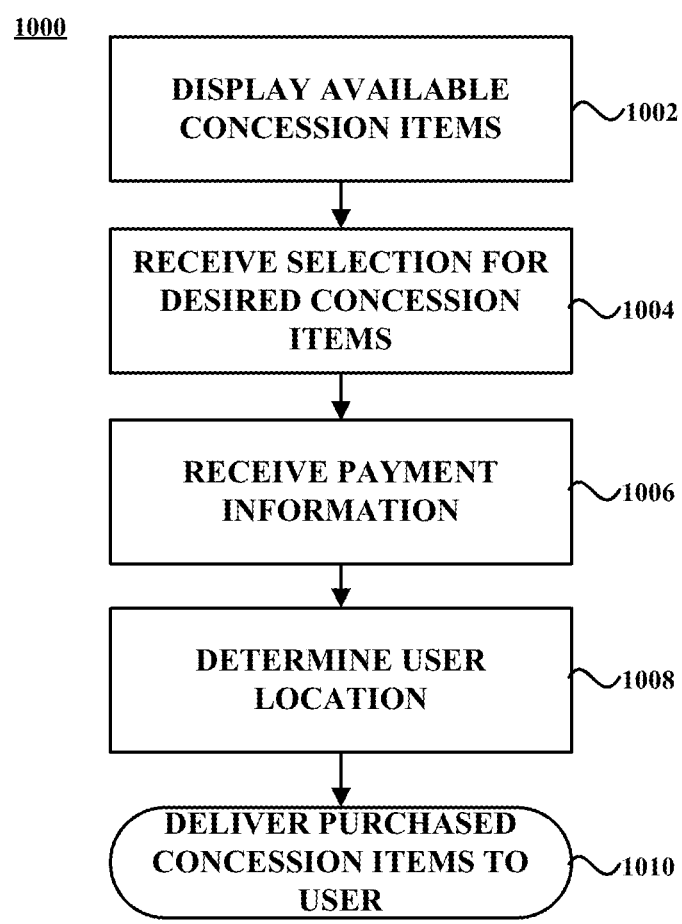
FIG. 10 is a flowchart illustrating a process for providing concessions order and delivery at an event or venue, consistent with some embodiments.

FIG. 10 is a flowchart illustrating a process 1000 for providing concessions order and delivery at an event or venue, consistent with some embodiments. For the purpose of illustration, FIG. 10 may be described with reference to any of FIG. 1-4, 5A-5C, or 6A-6C. Process 1000 may be embodied in computer-readable instructions for execution by one or more processors in processing component 206 such that the steps of the method may be performed by client mobile device 102, remote server 104, or a combination thereof. Process 1000 may be accessed by selecting link 302 of enhanced user experience application 110. As shown in FIG. 10, process 1000 begins by displaying available concession items to user 108 (1002). Consistent with some embodiments, available concession items may be stored in database 118 of remote server 104 and used by shopping and payment applications 114 for transmission to client mobile device 102 for display on display component 214. In some embodiments, available concession items may be provided to client mobile device 102 by a third party, such as Milo of San Jose, Calif. After user 108 has browsed the available concession items, user 108 may make a selection, and remote server 104 may receive the selection for the desired concession items (1004). Remote server 104 may then receive payment information from user 108 for completing payment for the desired concession items (1006). Payment may be processed and competed using shopping and payment applications 114, which may include an interface for a payment provider server such as PayPal, Inc. of San Jose, Calif. After the payment has been completed, remote server 104 may receive data relating to a user location from a scanned code on a ticket, a seat, a lamppost, or other event or venue marker, or from an image of the ticket or other marker, or from manual entry of the data and may determine the user location from this data (1008). Consistent with some embodiments, user 108 using client mobile device 102 having a scanning/camera component 220 may scan a QR, bar, or other code from a ticket, or OCR the seat information on the ticket to obtain data relating to a user location. The data relating to a user location from the scanning/imaging may be transmitted to remote server 104 to determine the user location using location applications 116 in combination with database 118. Alternatively, a location of user 108 may be determined using location component 222 of client mobile device 102, for example if user 108 is tailgating in the parking lot of the venue. Once the user location has been determined, the purchased items may be delivered to user 108 (1010).

Figure 11:
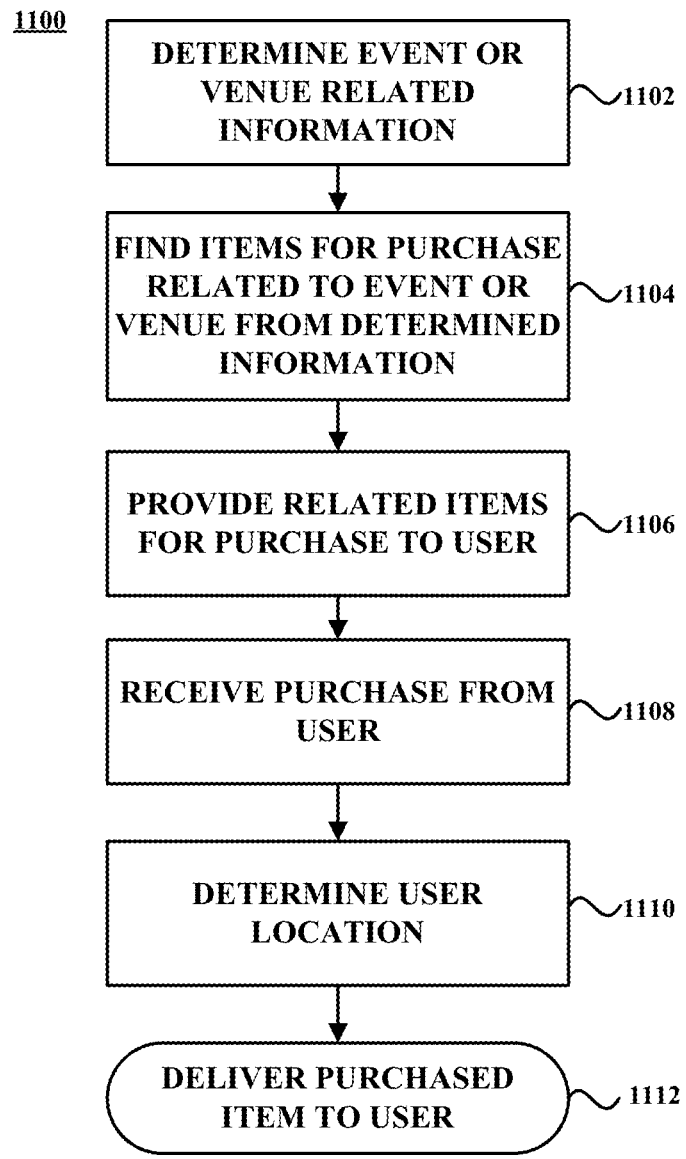
FIG. 11 is a flowchart illustrating a process for allowing a user to purchase merchandise for seat delivery, consistent with some embodiments.

FIG. 11 is a flowchart illustrating a process 1100 for allowing a user to purchase merchandise for seat delivery, consistent with some embodiments. For the purpose of illustration, FIG. 11 may be described with reference to any of FIG. 1-4, 5A-5C, or 6A-6C. Process 1100 may be embodied in computer-readable instructions for execution by one or more processors in processing component 206 such that the steps of the method may be performed by client mobile device 102, remote server 104, or a combination thereof. Process 1000 may be accessed by selecting link 320 of enhanced user experience application 110. As shown in FIG. 11, process 1100 begins by determining event or venue related information (1102). The event or venue related information may be stored in database 118 of remote server 104 and used by shopping and payment applications 114 for transmission to client mobile device 102 for display on display component 214 in accordance with enhanced user experience application 110. Alternatively, the event or venue related information may be determined from a location of user 108 using geofencing, geolocation, or from a scanned code on a ticket, or a captured image of the ticket, and then determining information about the event or venue from database 118. Next, items or merchandise for purchase related to the event or venue may be found according to the determined information (1104). The merchandise may be stored in database 118 of remote server 104 and used by shopping and payment applications 114 for transmission to client mobile device 102 for display on display component 214 in accordance with enhanced user experience application 110. Alternatively, the merchandise may be stored in a database provided by an online merchandise provider such as eBay, Inc. of San Jose, Calif. The related items and merchandise may then be provided to user 108 (1106).

A purchase may then be received from user 108 (1108). The purchase may include payment options and delivery information. If the delivery information includes an option to deliver to the user's seat or location, the user's location may be determined from a scanned code on a ticket, a seat, a lamppost, or other event or venue marker, or an image of the ticket or code, or from information provided by location component 220 of client mobile device 102 (1110). Consistent with some embodiments, user 108 using client mobile device 102 having a scanning/camera component 220 may scan a QR, bar, or other code from a ticket, or OCR the seat information on the ticket to obtain data relating to a user location. The data relating to a user location from the scanning/imaging may be transmitted to remote server 104 to determine the user location using location applications 116 in combination with database 118. Alternatively, a location of user 102 may be determined using location component 220 of client mobile device 102, for example if user 108 is tailgating in the parking lot of the venue. Once the user location has been determined, the purchased items may be delivered to user 108 (1112).

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Consequently, embodiments as described herein may provide an enhanced user experience application that is able to leverage technology enabled events and venues to provide an enhanced user application by providing a number of venue-specific location-based services and features in the palm of an event goers hand. The examples provided above are exemplary only and are not intended to be limiting. One skilled in the art may readily devise other systems consistent with the disclosed embodiments which are intended to be within the scope of this disclosure.

What is claimed is:

1. A system, comprising:
   a non-transitory memory; and
   one or more hardware processors coupled to the non-transitory memory and configured to read instructions from the non-transitory memory to perform operations comprising:
      receiving, from a user device through a network, an image captured by an image capturing subsystem on the user device and location data determined by a location determination subsystem on the user device;
      analyzing the image to determine a seat location at a venue;
      analyzing the location data to determine a vehicle location at the venue;
      storing, in a database, the vehicle location at the venue;
      generating first directions from the vehicle location at the venue to the seat location at the venue;
      providing, for display on the user device through the network, the first directions from the vehicle location at the venue to the seat location at the venue;
      retrieving, from the database subsequent to providing the first directions for display on the user device, the vehicle location at the venue;
      generating second directions to the vehicle location at the venue; and
      providing, for display on the user device through the network, the second directions to the vehicle location at the venue.

2. The system of claim 1, wherein the image includes a code, and the analyzing the image includes analyzing the code to retrieve the seat location at the venue that is encoded by the code.

3. The system of claim 1, wherein the analyzing the image includes performing optical character recognition on the image to retrieve the seat location at the venue that is included in text captured in the image.

4. The system of claim 1, wherein the location data includes global positioning system (GPS) coordinates.

5. The system of claim 1, wherein the generating the first directions from the vehicle location at the venue to the seat location at the venue includes:
   determining a gate at the venue that is closest to the seat location, wherein the providing the first directions for display on the display device includes identifying the gate.

6. The system of claim 1, wherein the operations further comprise:
   identifying a type of event occurring at the venue; and
   retrieving at least one event-related marker that is associated with the type of event, wherein the generating the first directions from the vehicle location at the venue to the seat location at the venue includes identifying at least one of the vehicle location at the venue and the seat location at the venue using the at least one event-related marker.

7. The system of claim 1, wherein the operations further comprises:
   determining, prior to providing the first directions for display on the user device, a shortest traffic route to the venue; and
   providing, for display on the user device through the network, the shortest traffic route to the venue.

8. The system of claim 1, wherein the operations further comprise:
   providing, for display on the user device through the network prior to providing the first directions for display on the user device, parking availability at the venue.

9. A method, comprising:
   receiving, from a user device through a network, an image captured by an image capturing subsystem on the user device and location data determined by a location determination subsystem on the user device;
   analyzing the image to determine a seat location at a venue;
   analyzing the location data to determine a vehicle location at the venue;
   storing, in a database, the vehicle location at the venue;
   generating first directions from the vehicle location at the venue to the seat location at the venue;
   providing, for display on the user device through the network, the first directions from the vehicle location at the venue to the seat location at the venue;
   retrieving, from the database subsequent to providing the first directions for display on the user device, the vehicle location at the venue;
   generating second directions to the vehicle location at the venue; and
   providing, for display on the user device through the network, the second directions to the vehicle location at the venue.

10. The method of claim 9, wherein the image includes a code, and the analyzing the image includes analyzing the code to retrieve the seat location at the venue that is encoded by the code.

11. The method of claim 9, wherein the analyzing the image includes performing optical character recognition on the image to retrieve the seat location at the venue that is included in text captured in the image.

12. The meth of claim 9, further comprising:
   determining, subsequent to providing the first directions for display on the user device, the wait times for a plurality of vendors that are located at the venue; and
   providing, for display on the user device through the network, the plurality of wait times for the plurality of vendors that are located at the venue.

13. The method of claim 12, further comprising:
   receiving, from the user device through the network, an identification of a first vendor of the plurality of vendors that are located at the venue;
   generating third directions from the seat location at the venue to the vendor that is located at the venue; and
   providing, for display on the user device through the network, the third directions from the seat location at the venue to the vendor that is located at the venue.

14. The method of claim 9, wherein the location data includes global positioning system (GPS) coordinates.

15. The method of claim 9, where the generating the first directions from the vehicle location at the venue to the seat location at the venue includes:

determining a gate at the venue that is closest to the seat location, wherein the providing the first directions for display on the display device includes identifying the gate.

16. The method of claim 9, further comprising:

identifying a type of event occurring at the venue; and retrieving at least one event-related marker that is associated with the type of event, wherein the generating the first directions from the vehicle location at the venue to the seat location at the venue includes identifying at least one of the vehicle location at the venue and the seat location at the venue using the at least one event-related marker.

17. The method of claim 9, further comprising:

determining, prior to providing the first directions for display on the user device, a shortest traffic route to the venue; and providing, for display on the user device through the network, the shortest traffic route to the venue.

18. The method of claim 9, further comprising:

providing, for display on the user device through the network prior to providing the first directions for display on the user device, parking availability at the venue.

19. The method of claim 9, further comprising:

providing, for display on the user device through the network, an interface that is configured to reserve a parking space at the venue.

20. The method of claim 9, further comprising:

receiving, through the network from the user device, an identification of a seat at the venue; and providing for display on the user device through the network, a seat view that includes a view from the seat at the venue.

* * * * *

UNITED STATES PATENT AND TRADEMARK OFFICE
CERTIFICATE OF CORRECTION

PATENT NO. : 9,733,271 B2  
APPLICATION NO. : 13/938460  
DATED : August 15, 2017  
INVENTOR(S) : Marc Hosein et al.

Page 1 of 1

It is certified that error appears in the above-identified patent and that said Letters Patent is hereby corrected as shown below:

In the Claims

In Column 18, Line 7, in Claim 7, delete "comprises:" and insert -- comprise: --, therefor.

In Column 18, Line 50, in Claim 12, delete "meth" and insert -- method --, therefor.

Signed and Sealed this  
Twenty-sixth Day of June, 2018

Andrei Iancu  
*Director of the United States Patent and Trademark Office*